US008976831B2

(12) United States Patent
Gomez-Iglesias et al.

(10) Patent No.: US 8,976,831 B2
(45) Date of Patent: Mar. 10, 2015

(54) EDGE-EMITTING SEMICONDUCTOR LASER

(71) Applicant: OSRAM Opto Semiconductors GmbH, Regensburg (DE)

(72) Inventors: Alvaro Gomez-Iglesias, Regensburg (DE); Guenther Groenninger, Seubersdorf (DE); Christian Lauer, Regensburg (DE); Harald Koenig, Bernhardswald (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/206,676

(22) Filed: Mar. 12, 2014

(65) Prior Publication Data

US 2014/0211821 A1    Jul. 31, 2014

Related U.S. Application Data

(62) Division of application No. 13/497,036, filed as application No. PCT/EP2010/062812 on Sep. 1, 2010, now Pat. No. 8,737,444.

(30) Foreign Application Priority Data

Sep. 17, 2009  (DE) .......................... 10 2009 041 934

(51) Int. Cl.
| | |
|---|---|
| *H01S 3/098* | (2006.01) |
| *H01S 5/00* | (2006.01) |
| *H01S 5/20* | (2006.01) |
| *B82Y 20/00* | (2011.01) |
| *H01S 5/343* | (2006.01) |

(52) U.S. Cl.
CPC . *H01S 5/20* (2013.01); *B82Y 20/00* (2013.01); *H01S 5/2031* (2013.01); *H01S 5/34313* (2013.01); *H01S 2301/16* (2013.01); *H01S 2301/166* (2013.01)

USPC .......................................... 372/45.01; 372/19

(58) Field of Classification Search
CPC ........ H01S 5/20; H01S 5/2018; H01S 5/0651
USPC .................................................. 372/19, 45.01
See application file for complete search history.

(56) References Cited

U.S. PATENT DOCUMENTS

| 7,471,711 B2* | 12/2008 | Kuramoto | .................. 372/45.01 |
|---|---|---|---|
| 2002/0001325 A1 | 1/2002 | Igarashi | |

(Continued)

FOREIGN PATENT DOCUMENTS

| CN | 1778024 | 5/2006 |
|---|---|---|
| EP | 1 727 250 | 11/2006 |

(Continued)

OTHER PUBLICATIONS

Fekete D. et al.: "InGaAs/GaAs 0.98-μm Low-Divergence Central-Lobe Semiconductor Lasers With delta-doped Resonant Tunneling Quantum Wells", IEEE Journal of Quantum Electronics, vol. 45, No. 6, pp. 700-710, Jun. 2009.

(Continued)

*Primary Examiner* — Armando Rodriguez
(74) *Attorney, Agent, or Firm* — Cozen O'Connor

(57) ABSTRACT

An edge emitting semiconductor laser comprising an active, radiation-generating zone (1), and an common waveguide (8), which is suitable for guiding the radiation generated in the active zone (1) within the semiconductor laser. The common waveguide (8) comprises a first n-doped layer (4) and a second n-doped layer (5), which is arranged between the first n-doped layer (4) and the active zone (1), wherein the refractive index $n_2$ of the second n-doped layer (5) is greater than the refractive index $n_1$ of the first n-doped layer (4) by a value dn.

15 Claims, 9 Drawing Sheets

(56) References Cited

U.S. PATENT DOCUMENTS

| | | |
|---|---|---|
| 2004/0208213 A1 | 10/2004 | Lichtenstein et al. |
| 2005/0201439 A1 | 9/2005 | Horie |
| 2007/0183469 A1 | 8/2007 | Ryu |
| 2008/0203418 A1* | 8/2008 | Yanamoto .................. 257/98 |
| 2009/0011531 A1 | 1/2009 | Yang |
| 2009/0080484 A1 | 3/2009 | Shigihara |
| 2009/0212277 A1 | 8/2009 | Akita et al. |
| 2010/0189153 A1 | 7/2010 | Brick |

FOREIGN PATENT DOCUMENTS

| | | |
|---|---|---|
| JP | H 04-000781 | 1/1992 |
| JP | 2003-060301 | 2/2003 |
| JP | 2006-521012 | 9/2006 |
| TW | 200917603 | 4/2009 |
| WO | WO 91/16747 | 10/1991 |
| WO | WO 00/05792 | 2/2000 |
| WO | WO 2004/084366 | 9/2004 |

OTHER PUBLICATIONS

Office Action dated Jan. 27, 2014 issued by the Japanese Patent Office in the corresponding Japanese patent application No. 2012-529204.

Office Action dated Jul. 26, 2013 issued by the Taiwanese Patent Office in the corresponding Taiwanese Patent Application No. 099129617.

* cited by examiner

EDGE-EMITTING SEMICONDUCTOR LASER

RELATED APPLICATIONS

This is division of U.S. patent application Ser. No. 13/497,036, filed on Jun. 29, 2012, now U.S. Pat. No. 8,737,444 which is a U.S. national stage of PCT Patent application No. PCT/EP2010/062812, filed on Sep. 1, 2010, and claims the priority of German Patent Application No. 10 2009 041 934.9 filed on Sep. 17, 2009, the disclosure content of which is hereby incorporated by reference.

The present application relates to an edge emitting semiconductor laser.

BACKGROUND OF THE INVENTION

Edge emitting semiconductor lasers generally have a waveguide in order to guide the radiation generated in an active zone of the semiconductor laser within the semiconductor laser.

Conventional waveguides generally comprise p-doped semiconductor layers, which can lead to a high series resistance of the device on account of the low hole mobilities. In order to reduce the series resistance of such a component, it has been attempted, for example, to increase the p-type doping of the p-doped region of the waveguide. In that case, however, there is the risk of the losses of the waveguide increasing which can result in an increase in the threshold current of the laser.

SUMMARY OF THE INVENTION

An object of the present invention is to specify an edge emitting semiconductor laser comprising an improved waveguide which enables a low series resistance of the semiconductor laser and enables very high efficiency at high currents.

An edge emitting semiconductor laser comprises, in particular:
  an active, radiation-generating zone, and
  a common waveguide, which is suitable for guiding the radiation generated in the active zone within the semiconductor laser, wherein
    the common waveguide comprises a first n-doped layer and a second n-doped layer, wherein the second n-doped layer is arranged between the first n-doped layer and the active zone, and
    the refractive index $n_2$ of the second n-doped layer is greater than the refractive index $n_1$ of the first n-doped layer by a value dn.

The term confinement factor (CF) hereinafter denotes the overlap of the respective laser mode of the semiconductor laser with the radiation-generating active zone of the semiconductor laser. Furthermore, the first-order laser mode is also designated by the term "fundamental laser mode".

The common waveguide has the task of increasing the confinement factor of the fundamental laser mode relative to the confinement factors of higher-order laser modes. In the present case, the common waveguide comprises a primary waveguide and also at least one further, higher-order waveguide, generally a secondary waveguide.

The primary waveguide guides the fundamental mode. In this case, the term "guiding" means that at least 50% of the total intensity of the mode is concentrated within the respective waveguide.

The primary waveguide preferably comprises the active zone and the second n-doped layer. The primary waveguide can furthermore comprise a so-called secondary well. A secondary well is formed, for example, by an undoped region that embeds the active zone. The undoped region generally has a higher refractive index than the layers of the common waveguide.

The secondary waveguide comprises the primary waveguide and, adjoining the second n-doped layer, the first n-doped layer, wherein the refractive index $n_2$ of the second n-doped layer is greater than the refractive index $n_1$ of the first n-doped layer by a value dn. The secondary waveguide is provided for guiding at least the second-order mode, if no higher-order waveguide is provided, all higher-order modes.

Even higher waveguides for guiding higher-order modes are also conceivable. The material composition and thickness of the respective layers which form the respective waveguide have to be chosen in such a way that the effective refractive index of the fundamental mode is high enough in order that the fundamental mode is guided in the primary waveguide but not in the secondary waveguide and—if present—in higher waveguides.

It should be pointed out at this juncture that the common waveguide can comprise further layers alongside the layers mentioned above. These further layers can be part of the primary waveguide, of the secondary waveguide or of a higher-order waveguide.

One aim of the present invention is to have a favourable influence on the confinement factors of the different modes by introducing primary and higher waveguides which guide the different laser modes differently. In particular, the present invention strives to increase the confinement factor of the fundamental laser mode relative to the confinement factor of higher-order laser modes.

In accordance with one particularly preferred embodiment of the semiconductor laser, the common waveguide is free of a p-doped layer.

Where mention is made of n-doped or p-doped layers in the present case, this is taken to mean that these layers have corresponding additional dopants (n- or p-type dopants). In the present case, undoped layers are understood to be layers into which no additional dopants are introduced in a targeted manner. However, such undoped layers may very well have an intrinsic doping, which arises unavoidably during the deposition of the layers, for example as a result of epitaxial growth in a reactor.

In this sense, the fact that the common waveguide is "free of a p-doped layer" means that the common waveguide has no layer that has additionally been doped with a p-type dopant in a targeted manner.

In accordance with a further embodiment, the common waveguide of the semiconductor laser has only one single very thin p-doped layer. Particularly preferably, this very thin p-doped layer has a thickness that is less than or equal to 10% of the thickness of the common waveguide, for example less than or equal to 200 nm. It should be pointed out at this juncture that the p-doped layer need not necessarily be embodied homogeneously with regard to the material. Rather, the material composition can vary within the p-doped layer.

If the common waveguide has no or only very thin p-doped layers, then this has the advantage that the series resistance of the semiconductor laser is reduced by comparison with a conventional semiconductor laser having thicker p-doped waveguide layers with the same common thickness of the common waveguide.

Particularly preferably, the fundamental mode of the laser radiation is substantially limited to the second n-doped layer.

This means in the present case that more than half of the intensity is concentrated in the second n-doped layer and the active zone.

In accordance with a further preferred embodiment of the semiconductor laser, the common waveguide furthermore has a first undoped layer, which is arranged between the active zone and the second n-doped layer, wherein the refractive index $n_3$ of the first undoped layer is greater than the refractive index $n_2$ of the second n-doped layer.

In this embodiment, a second undoped layer is furthermore preferably arranged within the common waveguide, said layer being arranged on the side of the active zone which lies opposite the first undoped layer. In this case, the active zone is embedded within the two undoped layers. The two undoped layers form an undoped region that can form a secondary well.

Furthermore, in this embodiment wherein the common waveguide has, alongside the first n-doped layer and the second n-doped layer, two undoped layers into which the active zone is embedded, it is possible for the first undoped layer and the second undoped layer to have different thicknesses. In this case, the active zone is thus arranged asymmetrically within an undoped region formed by the first and second undoped layers. Particularly preferably, in this case, the first undoped layer, which is arranged between the active zone and the second n-doped layer, is made thinner than the second undoped layer, which is arranged on the side of the active zone which is remote from the first undoped layer. As a result, the confinement factor of the fundamental mode can advantageously be increased further.

In accordance with a further embodiment of the semiconductor laser, the common waveguide additionally has an n-doped cladding layer and a p-doped cladding layer. A layer is designated as "cladding layer" in the present case if its refractive index is lower than the effective refractive index of the mode currently under consideration.

Generally, the semiconductor layers of the semiconductor laser, such as the active zone, the first undoped layer, the second undoped layer, the first n-doped layer, the second n-doped layer, but also the cladding layers, are grown epitaxially on a growth substrate. The growth substrate can comprise one of the following materials or consist of one of the following materials: gallium arsenide, indium phosphide, indium arsenide, indium antimonide, gallium antimonide, gallium nitride. If the growth substrate has a higher refractive index than that layer of the common waveguide which is closest to the growth substrate, then an n-doped cladding layer or a p-doped cladding layer is preferably arranged between the common waveguide and the growth substrate. In this case, the doping of the cladding layer is generally oriented towards the doping of the adjacent layers of the common waveguide, that is to say that an n-doped cladding layer is preferably arranged between the growth substrate and the common waveguide if that layer of the common waveguide which is arranged adjacent to the growth substrate is n-doped. If that layer of the common waveguide which is arranged adjacent to the growth substrate is p-doped, however, then a p-doped cladding layer is generally positioned between the growth substrate and the common waveguide.

By means of the p-doped cladding layer or the n-doped cladding layer between the growth substrate and the common waveguide, the modes of the laser radiation are advantageously effectively decoupled from the growth substrate. The efficiency of the semiconductor laser is thereby increased since the modes of the laser radiation would otherwise experience high optical absorption losses and/or the vertical far field of the semiconductor laser can be disturbed.

In this case, generally the n-doped cladding layer is arranged adjacent to the first n-doped layer of the common waveguide, while the p-doped cladding layer is arranged on the side of the active zone which lies opposite the n-doped layers.

In accordance with a further preferred embodiment, the confinement factor of the fundamental mode of the semiconductor laser per quantum well is between 1% and 0.4%, and particularly preferably between 0.6% and 0.4%, in each case inclusive of the limits.

In accordance with a further embodiment, the refractive index difference dn between the first n-doped layer and the second n-doped layer is between 0.03 and 0.1, inclusive of the limits. If the refractive index difference dn is relatively small, then the fundamental mode also propagates within the first n-doped layer, as a result of which the width of the far field of the semiconductor laser is advantageously significantly reduced.

The thickness of the second n-doped layer is furthermore preferably between 200 nm and 800 nm, once again inclusive of the limits.

Particularly preferably, the thickness of the second n-doped layer is between 8% and 20% relative to the thickness of the common waveguide.

In accordance with a further embodiment, the concentration of the n-type dopant within the first n-doped layer exhibits a profile which increases in a stepped manner or continuously towards the outer side of the common waveguide. In this way, it is generally possible to bring about an increase in optical losses on account of the absorption of free charge carriers for higher-order laser modes in order to suppress the formation of higher-order modes alongside the fundamental laser mode within the semiconductor laser.

In accordance with a further embodiment, the edge emitting semiconductor laser is based on an arsenide compound semiconductor material.

In this context, "based on arsenide compound semiconductor material" means that, in particular, the radiation-generating active zone of the edge emitting semiconductor laser preferably comprises $Al_nGa_mIn_{1-n-m}As$, where $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which, however, do not essentially change in the particular the refractive index of the material. For the sake of simplicity, however, the above formula only includes the essential constituents of the crystal lattice (Al, Ga, In, As), even if these can be replaced in part by small amounts of further substance.

A semiconductor laser based on an arsenide compound semiconductor material is suitable, in particular, for emitting laser radiation from the infrared spectral range.

DETAILED DESCRIPTION OF THE DRAWINGS

Identical or identically acting elements are provided with the same reference symbols in the figures. The figures should not be regarded as true to scale; rather, individual elements, for example layer thicknesses, may be illustrated with an exaggerated else for clarification purposes.

Figure 1:
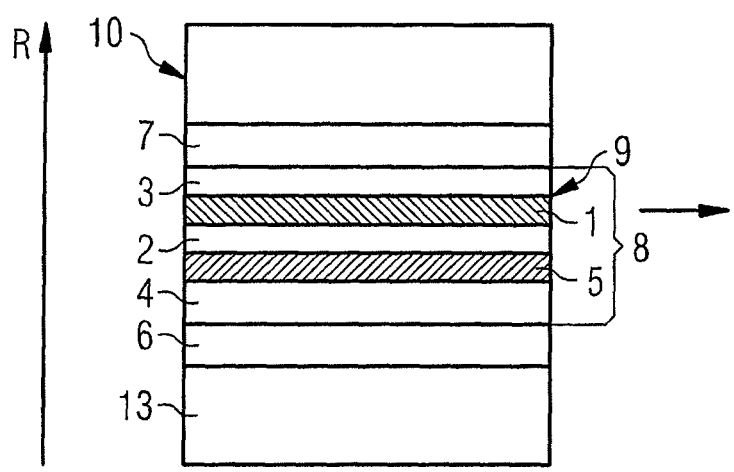
FIG. 1 shows a schematic sectional illustration of an edge emitting semiconductor laser in accordance with a first exemplary embodiment.

The edge emitting semiconductor laser in accordance with the exemplary embodiment in FIG. 1 has an active zone 1, which is suitable for generating electromagnetic radiation.

For the purpose of generating radiation, the active zone 1 preferably has a pn junction, a double heterostructure, a single quantum well or a multiple quantum well structure (MQW). Particularly preferably, the active zone 1 has a single quantum well for generating radiation. In this case, the designation quantum well structure does not include any indication about the dimensionality of the quantization. It therefore encompasses, inter alia, quantum wells, quantum wires and quantum dots and any combination of these structures.

In the case of the semiconductor laser in accordance with the exemplary embodiment in FIG. 1, the active zone 1 is arranged between a first undoped layer 2 and a second undoped layer 3. In this case, the first undoped layer 2 and the second undoped layer 3 are arranged in a manner directly adjoining the active zone 1, that is to say that the first undoped layer 2 and the second undoped layer 3 in each case form a common interface with the active zone 1. The active zone 1 is thus embedded into an undoped region formed by the first undoped layer 2 and the second undoped layer 3. The first undoped layer 2 and the second undoped layer 3 form an undoped region that acts as a secondary well.

Furthermore, the semiconductor laser in accordance with FIG. 1 comprises a first n-doped layer 4 and a second n-doped layer 5, wherein the second n-doped layer 5 is arranged between the active zone 1 and the first n-doped layer 4. In the present case, the second n-doped layer 5 is arranged in direct contact with the first undoped layer 2 and the first n-doped layer 4 is arranged in direct contact with the second n-doped layer 5, that is to say that the second n-doped layer 5 forms a common interface with the first undoped layer 2 and the first n-doped layer 4 forms a common interface with the second n-doped layer 5.

In the present case, the active zone 1, the two undoped layers 2, 3 and the two n-doped layers 4, 5 form the common waveguide 8 of the semiconductor laser, which is suitable for guiding the radiation generated in the active zone 1 within the semiconductor laser. In the present case, the active zone 1 is arranged within the common waveguide 8, to be precise symmetrically between the two undoped layers 2, 3 that form the undoped region of the common waveguide 8. In other words, the two undoped layers 2, 3 have the same thickness.

Furthermore, an n-doped cladding layer 6 is arranged adjacent to the first n-doped layer 4, while a p-doped cladding layer 7 is positioned adjacent to the second undoped layer 3 on that side of the active zone 1 which lies opposite the n-doped cladding layer 6. In the present case, the p-doped cladding layer 7 is arranged in direct contact with the second undoped layer 3, that is to say that the p-doped cladding layer 7 forms a common interface with the second undoped layer 3.

The layers of the common waveguide 8, that is to say in the present case the active zone 1, the first undoped layer 2, the second undoped layer 3, the first n-doped layer 4, the second n-doped layer 5, are grown epitaxially on a growth substrate 13. The layers of the common waveguide 8 are separated from the growth substrate 13 by an n-doped cladding layer 6.

The common waveguide 8 of the semiconductor laser in accordance with FIG. 1 is free of a p-doped layer. Its series resistance is therefore advantageously reduced by comparison with a component having p-doped layers within the common waveguide 8. The series resistance of the semiconductor laser relative to the area is preferably less than or equal to $2*10^{-4}$ $\Omega cm^2$, particularly preferably less than or equal to $10^{-5}$ $\Omega cm^2$.

The semiconductor laser has facets at its two side areas 9, 10 situated perpendicular to the main extension plane of the active zone 1, said facets being suitable for reflecting the radiation generated in the active zone 1. Therefore, during the operation of the semiconductor laser, along the main extension plane of the active zone 1, a standing wave of electromagnetic radiation forms within the semiconductor laser, which constitutes the laser radiation. This laser radiation is generally coupled out through one of the facets.

Figure 2:
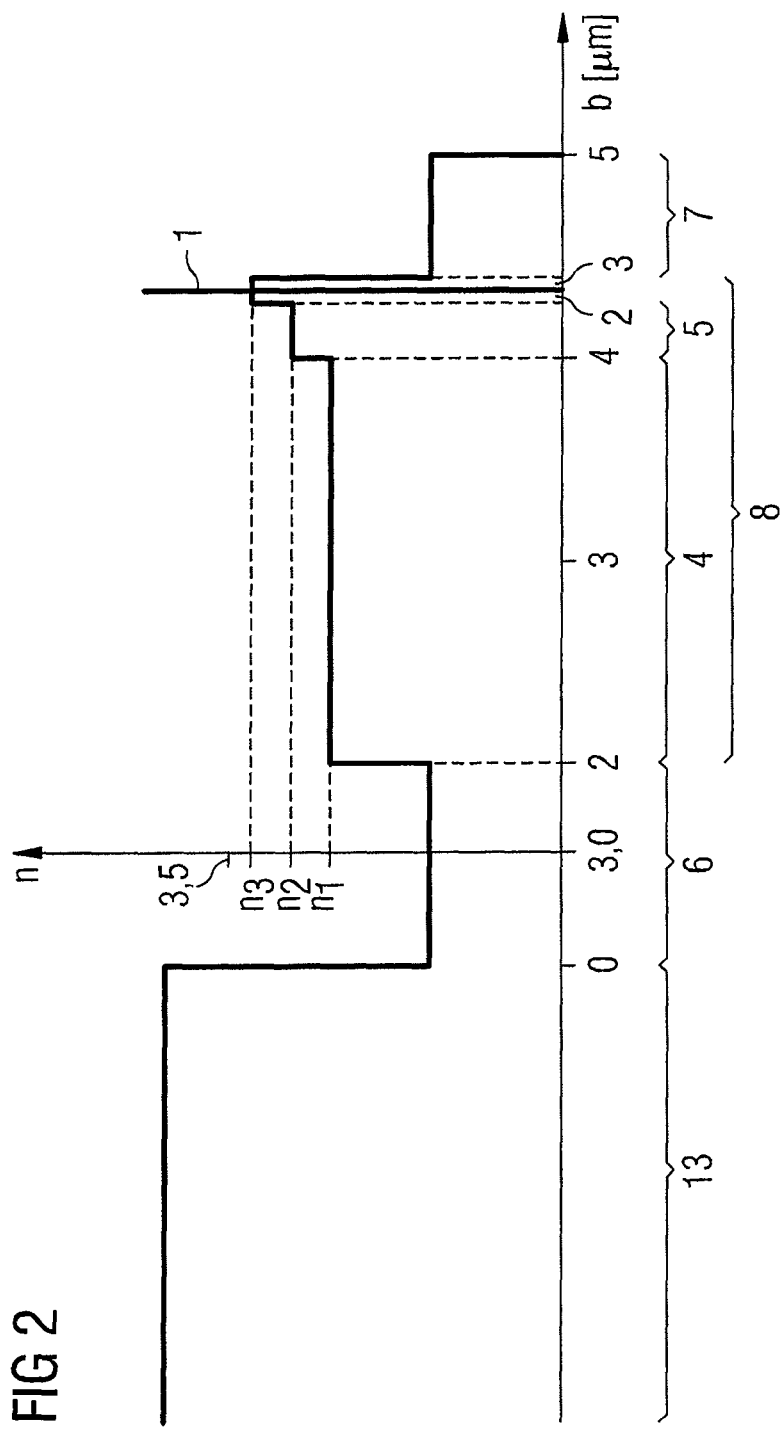
FIG. 2 shows a schematic illustration of the refractive index n of the edge emitting semiconductor laser in accordance with the exemplary embodiment from FIG. 1 along the direction R as a function of the distance b.

FIG. 2 illustrates the profile of the refractive index n within the semiconductor laser along the direction R in accordance with FIG. 1 as a function of the thickness b of the layers of the semiconductor laser. In this case, the refractive index profile begins with the refractive index of the growth substrate 13, which is approximately 3.6. Arranged in a manner adjoining the growth substrate 13 is the n-doped cladding layer 6, which has a thickness of between approximately 0.7 and approximately 1 μm and a refractive index of approximately 3.2. In the present case, the n-doped cladding layer 6 has the task of decoupling the modes of the laser radiation from the growth substrate 13.

The first n-doped layer 4, which is situated in direct contact with the n-doped cladding layer 6, has a thickness of approximately 1.8 μm and a refractive index $n_1$ of approximately 3.37. Furthermore, arranged in a manner directly adjoining the first n-doped layer 4 is the second n-doped layer 5, which has a thickness of approximately 0.35 μm and a refractive index $n_2$ of approximately 3.41.

The refractive index $n_2$ of the second n-doped layer 5 is thus greater than the refractive index $n_1$ of the first n-doped layer 4 by a value dn of approximately 0.04.

Particularly preferably, the refractive index difference dn between the first n-doped layer 4 and the second n-doped layer 5 is between 0.04 and 0.05, inclusive of the limits.

The first undoped layer 2 and the second undoped layer 3 both have a thickness of between 10 nm and 100 nm and a refractive index of approximately 3.45. The refractive index $n_3$ of the first undoped layer 2 is thus greater than the refractive index $n_2$ of the second n-doped layer 5. The active zone 1, which is embedded into the two undoped layers 2, 3, has a refractive index of approximately 3.6. The thickness of the active zone 1 is generally between 3 nm and 12 nm, for example approximately 7 nm.

In the present case, the p-doped cladding layer 7, which is arranged in a manner directly adjoining the second undoped layer 3, has a thickness of approximately 0.7 μm and a refractive index of approximately 3.2.

In the present case, the semiconductor laser is based on an arsenide compound semiconductor material and is suitable for emitting laser radiation from the infrared spectral range with a wavelength of approximately 965 nm.

The present concept for an common waveguide of an edge emitting semiconductor laser is, however, not restricted to this material group or to this emission wavelength. Rather, the present concept can also be applied to other materials and emission wavelengths, for example 808 nm.

The n-doped cladding layer 6 and the p-doped cladding layer 7, the first n-doped layer 4 and the second n-doped layer 5 and also the first undoped layer 2 and the second undoped layer 3 comprise AlGaAs having different aluminium contents. In this case, the different aluminium contents of the layers lead to the above-described differences in the refractive indices of the layers.

The p-doped cladding layer 7 and the n-doped cladding layer 6 have an aluminium content of approximately 50%, while the aluminium content of the two undoped layers 2, 3 is approximately 11%. The first n-doped layer 4 has an aluminium content of approximately 25%, while the second n-doped layer 5 has an aluminium content of approximately 19%.

In the present case, the active zone 1 has InGaAs quantum structures for generating radiation. In contrast to the rest of the layers, the active zone 1 contains no aluminium in the present case. However, it should be pointed out that the active zone 1 generally comprises aluminium in particular for emission wavelengths of less than 850 nm.

Figure 3:
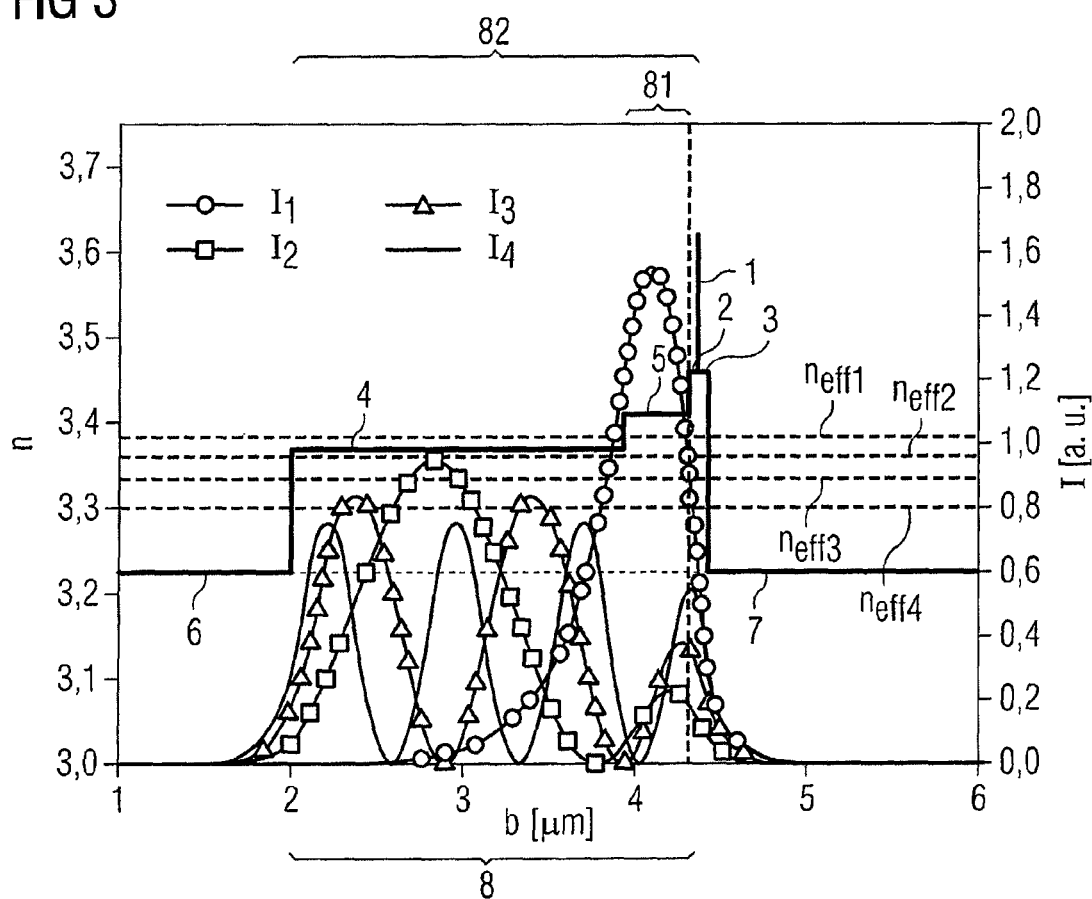
FIG. 3 shows a schematic illustration of the refractive index profile of the semiconductor laser in accordance with the exemplary embodiment from FIG. 1 with the intensity profiles I of the optical modes up to the fourth order within the common waveguide.

FIG. 3 shows the refractive index profile of the semiconductor laser in accordance with FIG. 1 such as has already been described with reference to FIG. 2. Furthermore, the intensities $I_1$, $I_2$, $I_3$, $I_4$ of the modes of the laser radiation which form within the common waveguide 8 up to the fourth order and also the effective refractive indices $n_{eff1}$, $n_{eff2}$, $n_{eff3}$, $n_{eff4}$ thereof are plotted in FIG. 3.

In this case, the fundamental mode of the laser radiation, that is to say the first-order mode, is localized distinctly within the second n-doped layer 5, that is to say that at least half of the intensity of the fundamental mode is localized within the second n-doped layer 5. In this case, the intensity profile $I_1$ of the fundamental mode has a single maximum having a normalized value of approximately 1.6, which is situated within the second n-doped layer 5. In this case, the intensity $I_1$ falls from its maximum steeply to the undoped layers 2, 3 and the active zone 1 and exhibits a small falling tail into the p-doped cladding layer 7. The intensity of the fundamental mode $I_1$ falls more shallowly on that side of the maximum which is remote from the active zone 1. It extends through the first n-doped layer 4. The intensity of the fundamental mode within the n-doped cladding layer 6 is negligibly small.

In the present case, the active zone 1, the first undoped layer 2, the second undoped layer 3 and the second n-doped layer 5 form a primary waveguide 81 suitable for guiding the fundamental laser mode.

The intensities $I_2$, $I_3$ and $I_4$ of the second-, third- and fourth-order modes likewise have a local maximum within the second n-doped layer 5 near the undoped layers 2, 3, but said local maximum is in each case distinctly smaller than the value of the maximum of the fundamental mode. The second-order mode here has a maximum of approximately 0.2, while the maximum of the third-order mode is approximately 0.4 and the maximum of the fourth-order mode is approximately 0.5.

In the present case, the active zone 1, the first undoped layer 2, the second undoped layer 3, the first n-doped layer 4 and the second n-doped layer 5 form a secondary waveguide 82 suitable for guiding higher-order laser modes.

The common waveguide 8 comprises the layers of the primary waveguide 81 and the layers of the secondary waveguide 82. In the present case, the common waveguide 8 is formed by the active zone 1, the first undoped layer 2, the second undoped layer 3, the first n-doped layer 4 and the second n-doped layer 5.

Since the higher-order modes, in particular the second- and third-order modes, have a local maximum within the second n-doped layer 5 which is distinctly smaller than the maximum of the fundamental mode, the probability of the occurrence of higher-order modes, in particular of the second- or third-order mode, is advantageously low. Higher-order modes, generally starting from the fourth-order mode, often exhibit tails into the cladding layers, in which they experience high optical losses on account of the higher doping. Consequently, the occurrence of higher-order modes is generally rather low.

The intensity $I_2$ of the second-order mode furthermore has a single further local maximum within the first n-doped layer 4 at a value of approximately 1.0 and a position b of approximately 2.75 μm. In this case, the width of this further maximum is approximately 1.6 μm.

The intensity $I_3$ of the third-order mode has two further local maxima each having a value of approximately 0.8, which are likewise positioned within the first n-doped layer 4. In this case, the width of these two maxima is approximately 1 μm. The maxima are arranged symmetrically with respect to the local minimum of the curve at a position b=2.9 μm.

The intensity $I_4$ of the fourth-order mode has three further local maxima each having a value of approximately 0.7. These further local maxima of the intensity $I_4$ of the fourth-order mode are also positioned within the first n-doped layer 4. In this case, the width of these three maxima is approximately 0.7 μm and the maxima are arranged symmetrically with respect to the maximum of the average maximum at a position b=2.9 μm.

As a consequence of the intensity profile of the different modes within the semiconductor laser, the values of the effective refractive indices $n_{eff1}$, $n_{eff2}$, $n_{eff3}$, $n_{eff4}$ decrease as the mode order increases. The effective refractive index $n_{eff1}$ of the fundamental mode is approximately 3.38, the effective refractive index $n_{eff2}$ of the second-order mode is approximately 3.36, the effective refractive index $n_{eff3}$ of the third-order mode is approximately 3.34 and the effective refractive index $n_{eff4}$ of the fourth-order mode is approximately 3.33.

Figure 4:
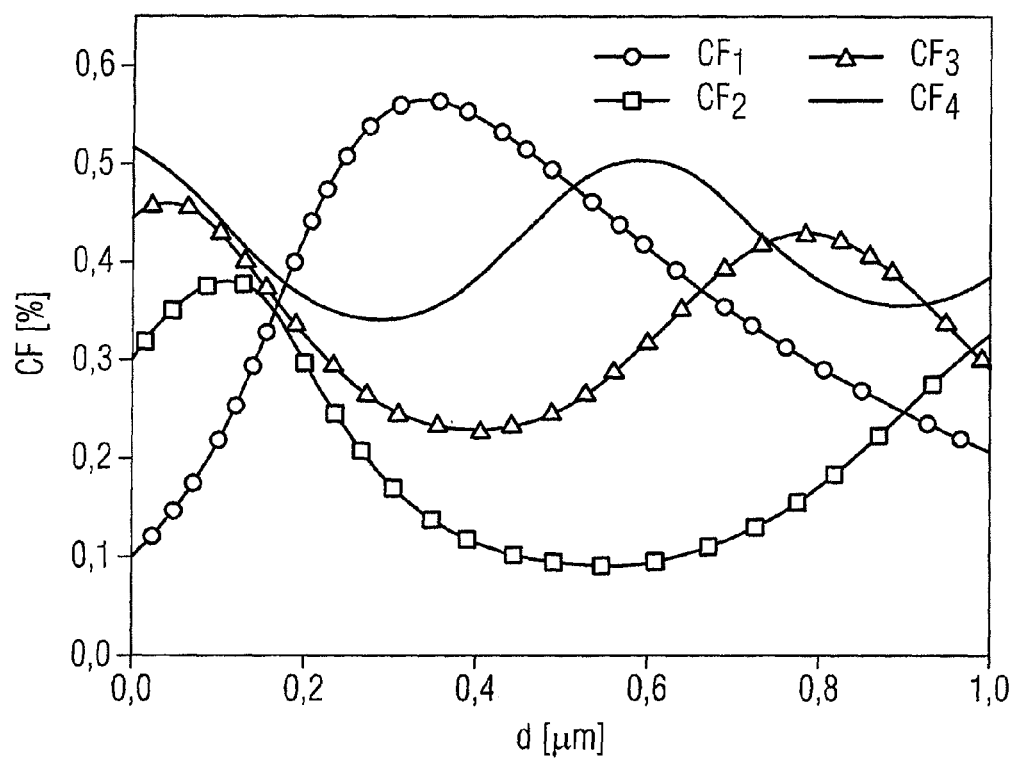
FIG. 4 shows a schematic illustration of the confinement factor CF for different modes of the semiconductor laser in accordance with the exemplary embodiment from FIG. 1 as a function of the thickness d of the second n-doped layer.

FIG. 4 shows the confinement factor $CF_1$, $CF_2$, $CF_3$, $CF_4$ of the fundamental laser mode and of the second-, third- and fourth-order modes as a function of the thickness d of the second n-doped layer 5 for the exemplary embodiment in accordance with FIGS. 1, 2 and 3. In this case, the total thickness of the common waveguide 8 is kept constant. It is approximately 2.3 µm. The confinement factor $CF_1$ of the fundamental laser mode has a maximum value of approximately 0.55% with a thickness d of the second n-doped layer 5 of approximately 0.3 µm, while the maximum values of the confinement factors $CF_2$, $CF_3$, $CF_4$ of the second-, third- and fourth-order laser modes are shifted distinctly to higher values of the thickness d of the second n-doped layer 5. Furthermore, the confinement factor $CF_1$ of the fundamental laser mode has, at the origin of the graph, that is to say for the case where the common waveguide 8 is free of a second n-doped layer 5, a value that is lowered by comparison with the values of the confinement factor of the second-, third- and fourth-order modes. This means that, in a conventional common waveguide having only a single n-doped layer rather than two n-doped layers 4, 5, as is provided in the present case, the confinement factor $CF_1$ of the fundamental laser mode is lower than the confinement factors $CF_2$, $CF_3$, $CF_4$ of the higher-order modes, such that the risk of the occurrence of undesired higher-order laser modes is increased.

Figure 5:
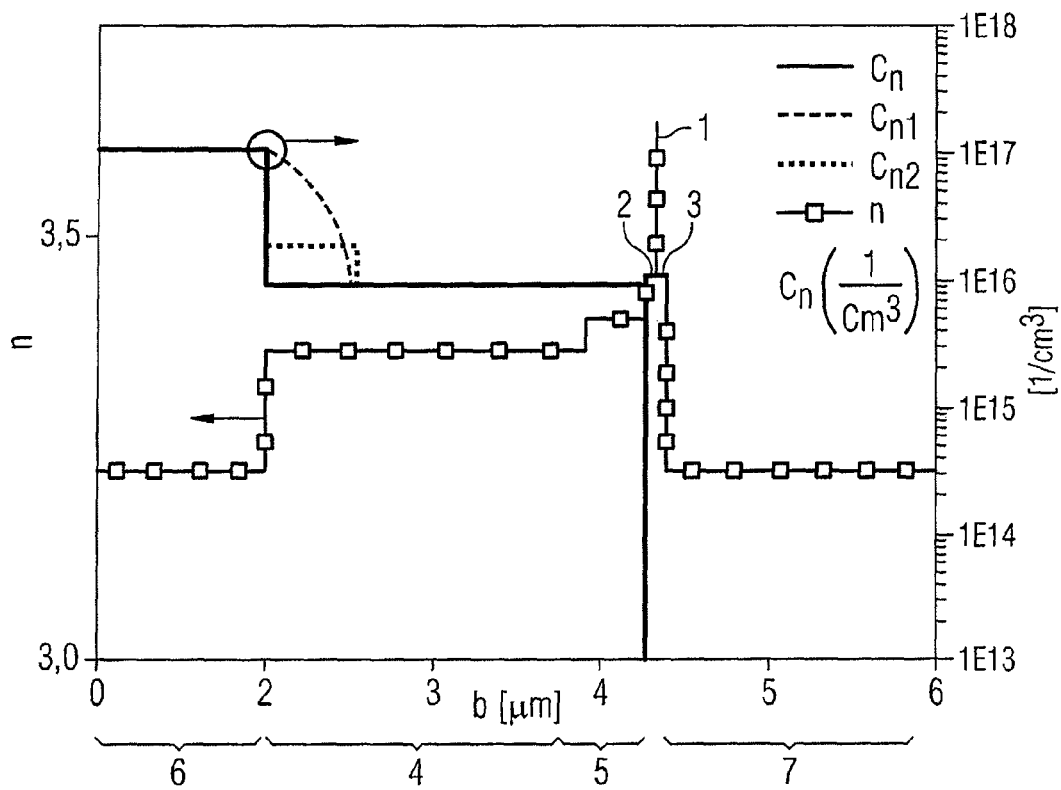
FIG. 5 shows a schematic illustration of the refractive index profile of the semiconductor laser in accordance with the exemplary embodiment from FIG. 1 and also three different profiles of the n-type dopant concentration $c_n$ along the direction R in accordance with three different exemplary embodiments.

FIG. 5 shows the profile of the refractive index n of the edge emitting semiconductor laser in accordance with the exemplary embodiment from FIG. 1 such as has already been described in detail with reference to FIG. 2. Furthermore, FIG. 5 schematically illustrates a first n-type doping profile $c_n$ within the semiconductor laser. As an alternative thereto, two further modified n-type doping profiles $c_{n1}$ and $c_{n2}$ are illustrated schematically, in the case of which the doping increases towards the side of the first n-doped layer 4 which is remote from the active zone 1. The side of the first n-doped layer 4 which is remote from the active zone 1 forms an outer side of the common waveguide 8.

In this case, by way of example, tellurium or silicon can be used as n-type dopants.

The first n-type doping profile $C_n$ has a concentration of the n-type dopant of approximately $1 \; 10^{17} \; cm^{-3}$ within the n-doped cladding layer 6 and falls to a value of approximately $1 \; 10^{16} \; cm^{-3}$ at the transition to the first n-doped layer 4. The first n-doped layer 4 and the second n-doped layer 5 have the same n-type dopant content of $1 \; 10^{16} \; cm^{-3}$, that is to say that the first n-type doping profile $C_n$ proceeds in a constant fashion at a value of approximately $1 \; 10^{16} \; cm^{-3}$ within the first n-doped layer 4 and the second n-doped layer 5. At the transition to the undoped region formed by the two undoped layers 2, 3, the first n-type doping profile $C_n$ falls sharply towards zero.

In contrast to the first n-type doping profile $c_n$, the first modified n-type doping profile $c_{n1}$ rises continuously within a thickness of the first n-doped layer 4 of approximately 0.5 µm to the side of the first n-doped layer 4 which is remote from the active zone 1. In this case, the first modified n-type doping profile has a profile in accordance with an inverted parabola.

The second modified n-type doping profile $C_{n2}$ rises in the same way as the first modified n-type doping profile within a thickness of approximately 0.5 µm of the first n-doped layer 4 to the side of the first n-doped layer 4 which is remote from the active zone 1. In contrast to the first modified n-type doping profile $c_{n1}$, however, the second n-type doping profile $C_{n2}$ proceeds in accordance with a rectangular function with a value of approximately $2 \; 10^{16} \; cm^{-3}$.

Since the fundamental laser mode is largely limited to the second n-doped layer 5 and the first undoped layer 2, a modified n-type doping profile, as described by way of example with reference to FIG. 5, can advantageously be used to increase the losses of the higher-order modes on account of absorption of free charge carriers.

Figure 6:
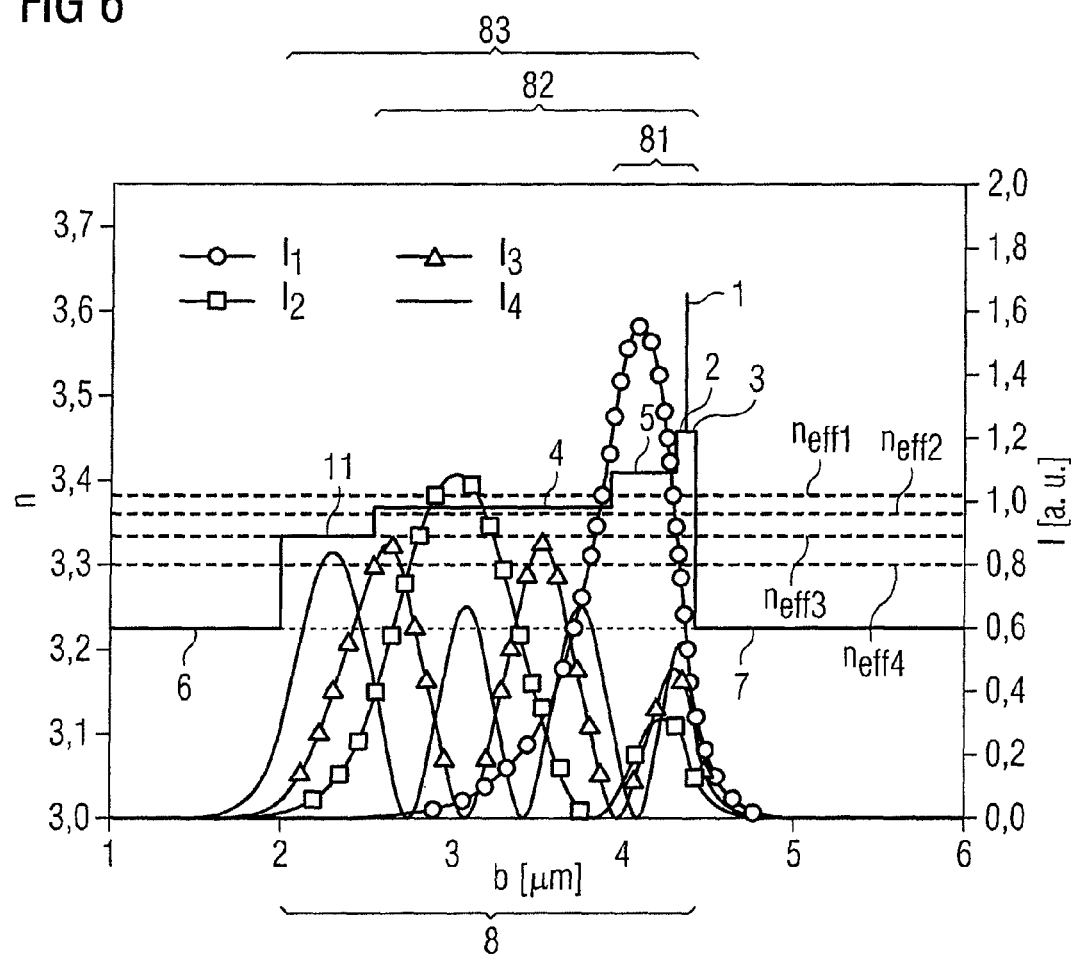
FIG. 6 shows a schematic illustration of the refractive index profile n of an edge emitting semiconductor laser in accordance with a second exemplary embodiment with the intensity profiles of the optical modes up to the fourth order within the common waveguide.
Figure 7:
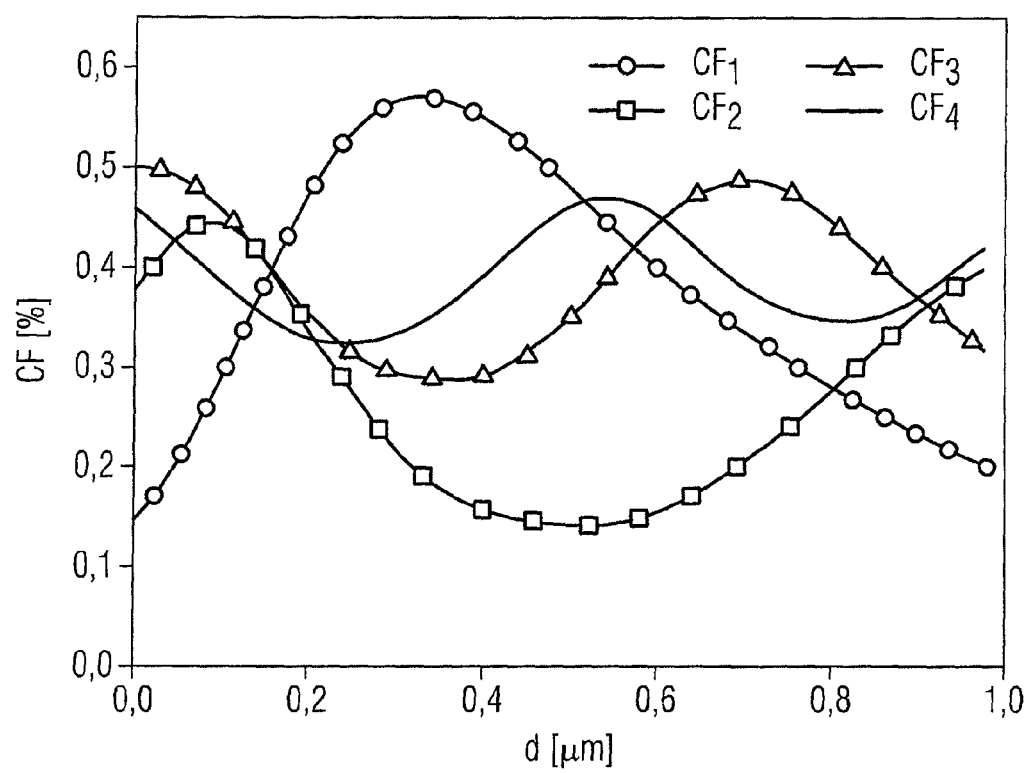
FIG. 7 shows a schematic illustration of the confinement factor CF for different modes of the semiconductor laser in accordance with the second exemplary embodiment as a function of the thickness d of the second n-doped layer.

The semiconductor laser in accordance with the second exemplary embodiment in FIGS. 6 and 7 has, in contrast to the semiconductor laser in accordance with the first exemplary embodiment in FIGS. 1 to 3, a third n-doped layer 11 arranged in a manner adjoining the first n-doped layer 4. In order to avoid repetition, in particular the differences of the semiconductor laser in accordance with the second exemplary embodiment in comparison with the semiconductor laser in accordance with the first exemplary embodiment are described below.

The thickness of the common waveguide 8 in accordance with the second exemplary embodiment is kept constant by comparison with the first exemplary embodiment. The third n-doped layer 11 has a thickness of approximately 0.5 µm, while the first n-doped layer 4 has a thickness of 1.5 µm.

The third n-doped layer 11 is arranged in direct contact with the first n-doped layer 4. The refractive index $n_3$ of the third n-doped layer 11 is lower than the refractive index $n_1$ of the first n-doped layer 4 by a second refractive index difference $dn_2$.

Particularly preferably, the second refractive index difference $dn_2$ between the first n-doped layer 4 and the third n-doped layer 5 is likewise between 0.04 and 0.05, inclusive of the limits.

With the aid of the third n-doped layer 11 and the second refractive index difference $dn_2$ between the first n-doped layer 4 and the third n-doped layer 11, a further higher-order waveguide 83, namely a third-order waveguide, is provided in the present case. The third-order waveguide 83 contributes to guiding the higher-order modes.

In the present case, the third-order waveguide 83 comprises the active zone 1, the first undoped layer 2, the second undoped layer 3, the first n-doped layer 4, the second n-doped layer 5 and the third n-doped layer 11.

The second refractive index difference $dn_2$ between the first n-doped layer 4 and the third n-doped layer 11 leaves the intensity profile $I_1$ of the fundamental mode substantially unchanged, while the intensity profiles $I_2$, $I_3$, $I_4$ of the higher-order modes experience a slight change. Thus, by way of example, the intensity profile $I_2$ of the second-order mode has a slightly higher maximum by comparison with the first exemplary embodiment (cf. FIG. 3).

FIG. 7 shows, in a manner equivalent to FIG. 4, the confinement factors $CF_1$, $CF_2$, $CF_3$, $CF_4$ of the fundamental laser mode and of the second-, third- and fourth-order modes as a function of the thickness d of the second n-doped layer 5 for the exemplary embodiment in accordance with FIG. 6. In this case, the thickness of the third n-doped layer 11 is modified in such a way that the total thickness of the common waveguide 8 is kept constant.

As shown in FIG. 7, a third n-doped layer 11 with a further refractive index difference $dn_2$ can be introduced into the semiconductor laser structure in accordance with FIGS. 1, 2 and 3 without the performance of the semiconductor laser changing significantly.

Furthermore, FIG. 7 shows that the confinement factors $CF_2$, $CF_3$, $CF_4$ of the higher modes with a thickness of the second n-doped layer 5 of approximately 300 nm are still suppressed relative to the confinement factor $CF_1$ of the fundamental mode.

Figure 8:
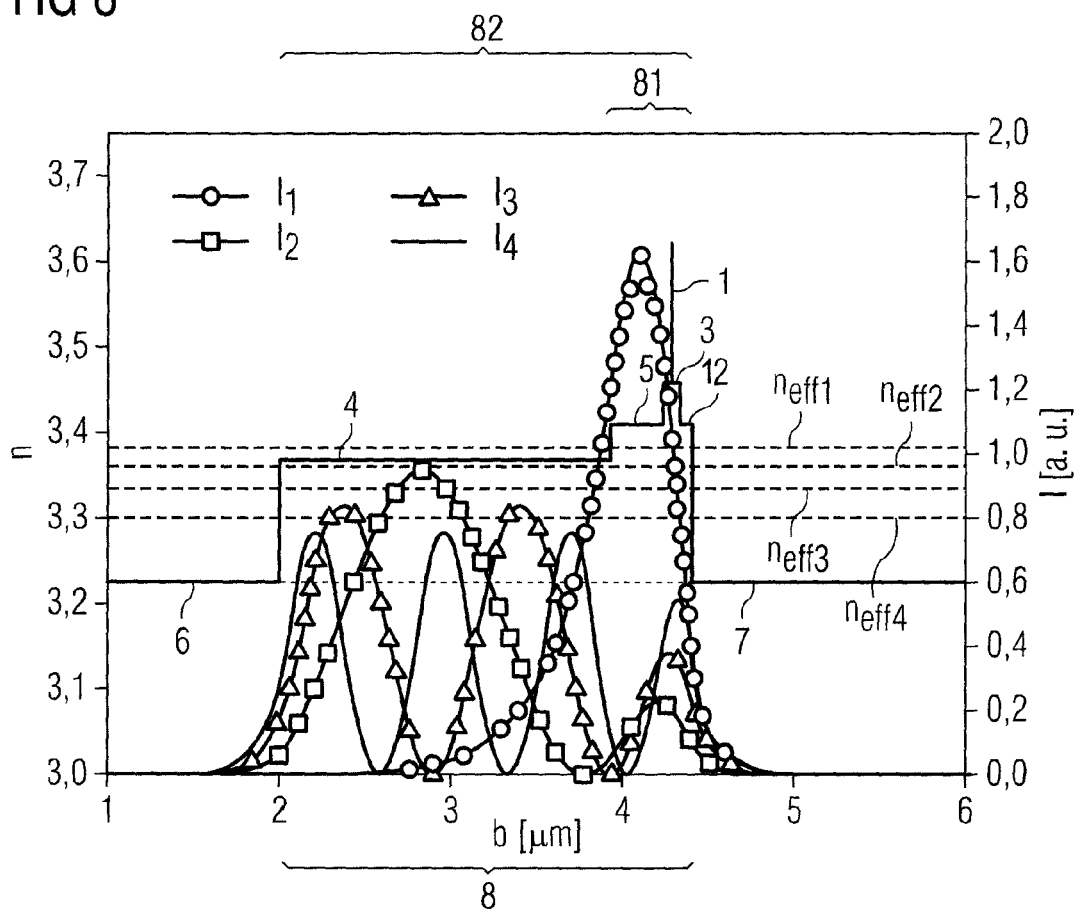
FIG. 8 shows a schematic illustration of the refractive index profile n of an edge emitting semiconductor laser in accordance with a third exemplary embodiment with the intensity profiles of the optical modes up to the fourth order within the common waveguide.
Figure 9:
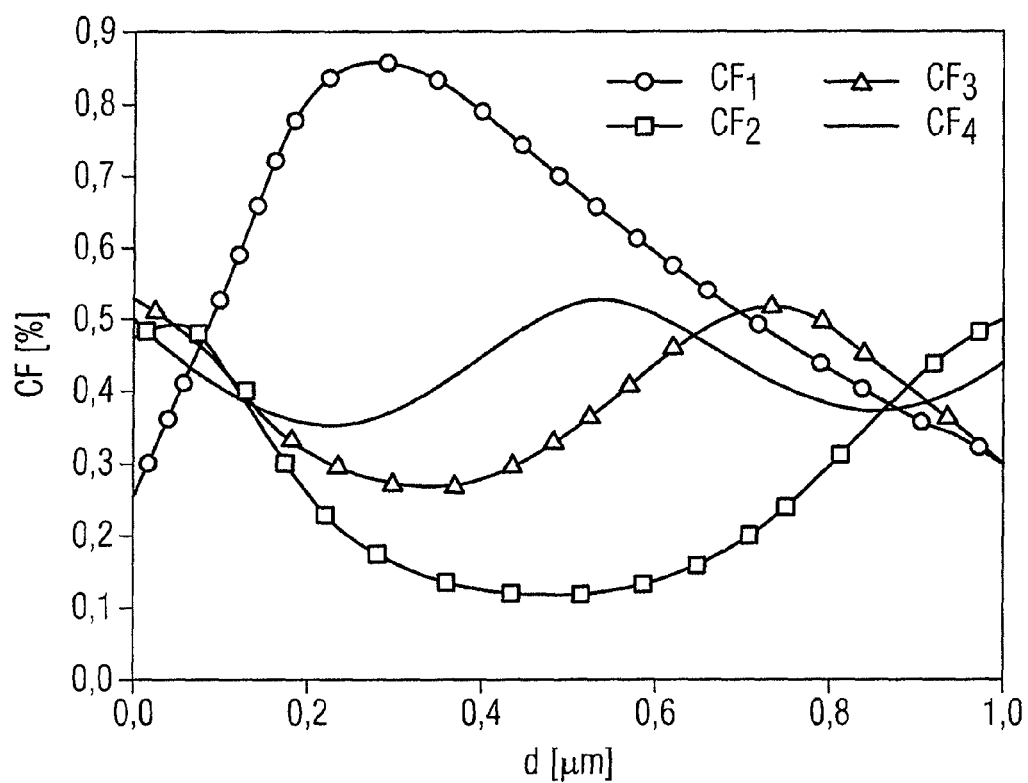
FIG. 9 shows a schematic illustration of the confinement factor CP for different modes of the semiconductor laser in accordance with the third exemplary embodiment as a function of the thickness d of the second n-doped layer.

The semiconductor laser in accordance with the third exemplary embodiment in FIGS. 8 and 9 has, in contrast to the semiconductor laser in accordance with the first exemplary embodiment in FIGS. 1 to 3, a very thin p-doped layer 12 within the common waveguide 8.

In order to avoid repetition, in particular the differences of the semiconductor laser in accordance with the third exemplary embodiment in comparison with the semiconductor laser in accordance with the first exemplary embodiment are described below.

The p-doped layer 12 is arranged between the p-doped cladding layer 7 and the second undoped layer 3. It has approximately the same refractive index as the second n-doped layer 5. The p-doped layer 12 is particularly preferably not thicker than 10% of the thickness of the common waveguide 8. In the present case, the p-doped layer 12 has a thickness of approximately 50 nm.

If the intensity profiles $I_2$, $I_3$, $I_4$ of the second-, third- and fourth-order modes in FIG. 8 are considered in comparison with FIG. 3, then it can be seen that these do not change significantly as a result of the introduction of the p-doped layer 12. The active zone 1, however, is shifted in the direction of the maximum of the fundamental mode on account of the p-doped layer 12, such that the confinement factor $CF_1$ of the fundamental mode is significantly increased.

The confinement factors of the fundamental laser mode and of the second-, third- and fourth-order laser modes of the third exemplary embodiment as a function of the thickness d of the second n-doped layer 5 are illustrated in FIG. 9. In this case, the thickness of the p-doped layer 12 is kept constant and the thickness of the first n-doped layer 4 is varied, such that the thickness of the common waveguide 8 remains constant.

FIG. 9 shows that the profile of the confinement factors $CF_2$, $CF_3$, $CF_4$ of the higher-order modes remains substantially unchanged, while the maximum of the confinement factor $CF_1$ of the fundamental laser mode is increased to approximately 0.85% relative to the first exemplary embodiment.

This patent application claims the priority of the German patent application DE 10 2009 041 934.9, the disclosure content of which is hereby incorporated by reference.

The invention is not restricted by the description on the basis of the exemplary embodiments. Rather, the invention encompasses any novel feature and also any combination of features, and in particular any combination of features in the patent claims, even if this feature or this combination of features itself is not explicitly specified in the patent claims or exemplary embodiments.

The invention claimed is:

1. An edge emitting semiconductor laser comprising:
   an active layer having a radiation-generating zone; and
   a common waveguide configured to guide the radiation generated in the active zone within the semiconductor laser,
   wherein the common waveguide comprises a first n-doped layer and a second n-doped layer;
   wherein the second n-doped layer is arranged between the first n-doped layer and the active layer;
   wherein a refractive index $n_2$ of the second n-doped layer is greater than a refractive index $n_1$ of the first n-doped layer by a value dn, and
   wherein the common waveguide has a single p-doped layer, the thickness of which is not greater than 10% of the thickness of the common waveguide.

2. The semiconductor laser of claim 1, wherein the common waveguide comprises a primary waveguide and a secondary waveguide, wherein the first n-doped layer is part of the secondary waveguide.

3. The semiconductor laser of claim 1, wherein the common waveguide further comprises a first undoped layer arranged between the active layer and the second n-doped layer, wherein a refractive index $n_3$ of the first undoped layer is greater than the refractive index $n_2$ of the second n-doped layer.

4. The semiconductor laser of claim 3, wherein the common waveguide comprises a second undoped layer arranged on the side of the active layer which lies opposite the first undoped layer.

5. The semiconductor laser of claim 4, wherein the first undoped layer and the second undoped layer have different thicknesses.

6. The semiconductor laser of claim 1, further comprising an n-doped cladding layer and a p-doped cladding layer.

7. The semiconductor laser of claim 1, wherein a fundamental mode of the laser radiation emitted from the semiconductor laser is substantially limited to the second n-doped layer.

8. The semiconductor laser of claim 1, wherein the refractive index difference do between the first n-doped layer and the second n-doped layer is between 0.03 and 0.1, inclusive.

9. The semiconductor laser of claim 1, wherein the thickness of the second n-doped layer has a value of between 8% and 20%, relative to the thickness of the common waveguide.

10. The semiconductor laser of claim 9, wherein the thickness of the second n-doped layer is between 200 nm and 800 nm, inclusive.

11. The semiconductor laser of claim 1, wherein the n-type dopant in the first n-doped layer rises in a stepped manner or continuously towards an outer side of the common waveguide.

12. The semiconductor laser of claim 1, wherein the semiconductor laser comprises an arsenide compound semiconductor material.

13. The semiconductor laser of claim 1, wherein the semiconductor laser emits laser radiation from the infrared spectral range.

14. The semiconductor laser of claim 1, wherein the active layer is arranged within the common wave guide.

15. The semiconductor laser of claim 1, wherein the common wave guide is free of a p-doped cladding layer and an n-doped cladding layer.

* * * * *